US 6,697,621 B2

(12) United States Patent
Taha et al.

(10) Patent No.: US 6,697,621 B2
(45) Date of Patent: Feb. 24, 2004

(54) METHOD AND APPARATUS FOR PROVIDING SERVICES IN A PRIVATE WIRELESS NETWORK

(75) Inventors: Mehmet Taha, Addison, IL (US); Denis Mattimoe, Cork (IE); Erick O'Connor, London (GB); Bilal Saleh, Lombard, IL (US)

(73) Assignee: Motorola, Inc., Schaumburg, IL (US)

( * ) Notice: Subject to any disclaimer, the term of this patent is extended or adjusted under 35 U.S.C. 154(b) by 265 days.

(21) Appl. No.: 10/002,451

(22) Filed: Nov. 15, 2001

(65) Prior Publication Data

US 2003/0092441 A1 May 15, 2003

(30) Foreign Application Priority Data

Dec. 6, 2000 (JP) .................................. 2000-370980

(51) Int. Cl.⁷ .................................................. H04Q 7/20
(52) U.S. Cl. ........................................................ 455/433
(58) Field of Search ........................... 455/432.1, 432.3, 455/433, 435.1, 426.1, 462, 465

(56) References Cited

U.S. PATENT DOCUMENTS

| 5,999,813 A | 12/1999 | Lu et al. ................. 455/435 |
| 6,029,067 A | 2/2000 | Pfundstein ............... 455/426 |
| 6,453,163 B1 * | 9/2002 | Karapetkov et al. ........ 455/433 |
| 2003/0086418 A1 * | 5/2003 | McIntosh et al. .......... 455/433 |

OTHER PUBLICATIONS

Technical Specification of a Digital cellular telecommunications system (Phase 2+) Multiple Subscriber Profile (MSP) Phase 1 Service description, Stage 1 (GSM 02.97 version 7.1.0 Release 1998).

* cited by examiner

*Primary Examiner*—Lee Nguyen
(74) *Attorney, Agent, or Firm*—Marshall, Gerstein & Borun LLP

(57) ABSTRACT

A visitor location register (140) of a private wireless network (130) is operable to interrogate multiple home location registers (126, 142). The VLR (140) may download one or more subscriber profiles from the multiple HLRs (126, 142) in order to support a variety of services to be offered to the subscriber within the private wireless network (130). The private wireless network (130) may be embedded within the public wireless network (100), and the VLR (140) may communicate with both a private network HLR (126) and a public network HLR (142).

17 Claims, 2 Drawing Sheets

METHOD AND APPARATUS FOR PROVIDING SERVICES IN A PRIVATE WIRELESS NETWORK

FIELD OF THE INVENTION

The invention relates to wireless communication networks, and more particularly to wireless private networks and a method and apparatus for providing services in a wireless private network.

BACKGROUND OF THE INVENTION

Wireless communication systems, such as cellular telephone communication systems, are commonplace. Wireless communication systems may comply with one or more standards or recommendations, such as the Global System for Mobile communication (GSM) recommendations. A system operating according to the GSM recommendations will typically include a switching system (SS), a base station system (BSS) and an operation and support system (OSS).

The base station system (BSS) provides all of the radio-related functions, and the BSS typically includes one or more base station controllers (BSCs) and a plurality of base transceiver stations (BTSs). The BSC provides all the control functions and physical links between the switching system and the BTS. The BSC is a high-capacity switch that provides functions such as handover, cell configuration, and control of radio frequency (RF) power levels in the BTSs.

The BTS handles the radio interface to the mobile station (MS). The MS is the subscriber equipment used to access the wireless communication network. The BTS includes the radio equipment (transceivers, antennas, amplifiers, etc.) needed to service each cell in the network. A group of BTSs is controlled by a BSC.

The operation and support system (OSS) is the functional entity from which the network operator monitors and controls the system. The purpose of the OSS is to provide centralized, regional and localized operation and maintenance activities required for wireless communication network operation. For example, the OSS provides a network overview and supports maintenance activities of different operation and maintenance organizations. The operation and support system (OSS) may include an operation and maintenance center (OMC) coupling all the equipment in the wireless communication network.

The switching system (SS) is responsible for performing call processing and subscriber related functions. The switching system includes: the home location register (HLR), the mobile services switching center (MSC), visitor location register (VLR), authentication center (AUC) and equipment identity register (EIR).

The Home Location Register (HLR) is the main database of permanent subscriber information for the wireless communication network. The HLR is an integral component of CDMA (code division multiple access), TDMA (time division multiple access), and GSM networks. Maintained by the subscriber's home network operator, the HLR contains pertinent subscriber information, including address, account status, and available services. The HLR interacts with a Gateway MSC and with the VLR.

The MSC performs the telephone switching functions of the network. The MSC controls calls to and from other telephone switching networks, such as a public switch telephone network (PSTN). It also performs such functions as toll ticketing, network interfacing, common channel signaling and others. The VLR is a database that contains temporary information about subscribers that is needed by the MSC in order to service visiting subscribers. A visiting subscriber is a subscriber receiving communication services in a network other than the subscriber's home network. When a subscriber roams into a new MSC area, the VLR servicing the area will request data about the subscriber's mobile station from the HLR of the subscriber's home network via a set of defined operations.

Many wireless communication networks cover relatively large geographic areas and utilize radio-frequency spectrum licensed to the network operator by a governmental authority. These networks typically service many thousands of subscribers and are considered public wireless networks.

A PBX (private branch exchange) is a telephone system within an enterprise that switches calls between enterprise users on local lines while allowing all users to share a certain number of external phone lines, i.e., phone lines connecting to the telephone company. The main purpose of a PBX is to save the cost of requiring a line for each user to the local telephone company's central office. The PBX is owned and operated by the enterprise rather than the telephone company (which may be a supplier or service provider).

In a manner similar to a PBX, a private wireless network may be set up to service a particular geographic area, e.g., a corporate campus, a shopping mall, an airport, etc. The private wireless network necessarily includes all the elements of a public wireless network, which means, the private wireless network will include a switching system, including an MSC, HLR and VLR, a base station system and an operation and support system.

The HLR stores a subscriber profile that includes a defined set of telecommunications services, as defined by the wireless network standards and recommendations, available to that subscriber. Typical services include voicemail, call waiting, call forwarding, short message service, data, etc. When the subscriber roams from the home network to a visited network, the subscriber's mobile station registers with the VLR of the visited network. The VLR in the visited network requests and receives a subset of the profile from the subscriber's home network HLR for servicing the subscriber in the visited network. A similar process occurs with a subscriber of a public wireless network visits a private wireless network contained within the public wireless network. One problem that exists, however, is that when the subscriber's mobile station registers with the private network VLR, the VLR receives a subset of the subscriber profile form the HLR for the subscriber for the public wireless network at large. As a result, the private wireless network operator cannot control the services that may be offered to the visiting subscriber. This limitation further prevents private network operators from providing differentiated services to private network users.

Thus there is a need for a method and apparatus for providing services in a private wireless network.

BRIEF DESCRIPTION OF THE DRAWINGS

The invention will be described in terms of several preferred embodiments to illustrate its broad teachings. Reference is also made to the attached drawings in which.

DETAILED DESCRIPTION OF THE PREFERRED EMBODIMENTS

In accordance with a preferred embodiment of the invention, a visitor location register (VLR) of a private wireless network is operable to interrogate multiple home location registers (HLRs). The VLR may download one or more subscriber profiles from the multiple HLRs in order to support a variety of services to be offered to the subscriber within the private wireless network. The private network may be embedded within the public network, and the VLR may communicate with both a private network HLR and a public network HLR.

Figure 1:
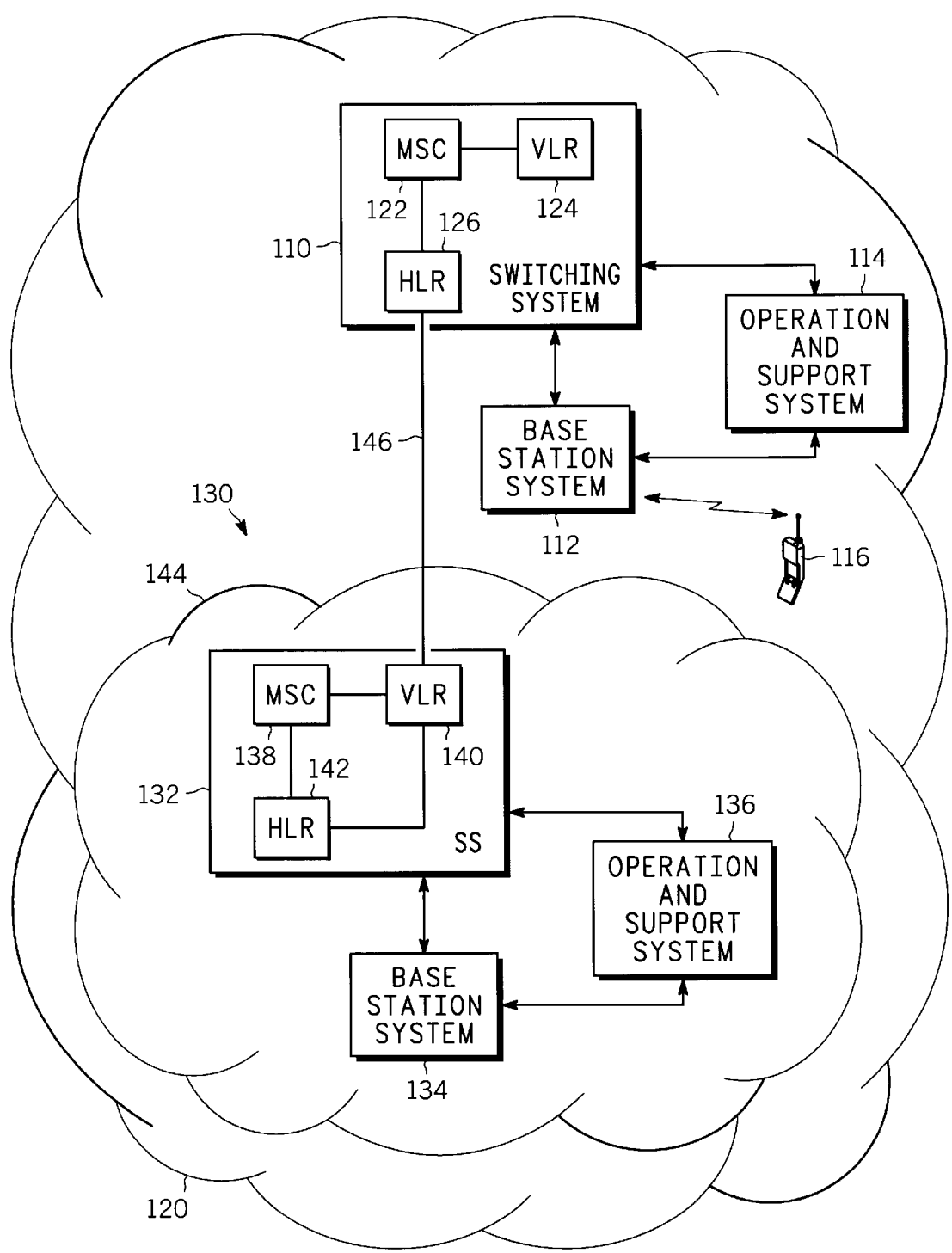
FIG. 1 is a representation of a public wireless communication network and a private wireless communication network that may be adapted in accordance with the preferred embodiments of the invention.

Referring to FIG. 1, a public wireless communication network 100 includes a switching system 110, a base station system 112 and an operations and support system 114 for providing service to mobile stations, one of which is indicated as mobile station 116. The public wireless communication network 100 provides communication services in a coverage area 120. The switching system 100 at least includes operatively coupled an MSC 122, a VLR 124 and an HLR 126. The base station system 112 is coupled to the switching system 110 and includes a BSC coupled to a plurality of BTSs (not depicted). The operation and support system 114 is coupled to each of the switching system 110 and the base station system 112.

The HLR 126 includes a database storing subscription information for a plurality of subscribers (network users) associated with the public wireless communication network 100. For each subscriber, the HLR includes a subscriber service profile, location information and activity status information.

Embedded within the coverage area 120 of the public wireless communication network 100 is a private wireless communication network 130. The private wireless communication network 130 includes a switching system 132, a base station system 134 and an operations and support system 114 for providing service to mobile stations, such as mobile station 116, operating within a coverage area 136 of the private wireless communication network 130. The switching system 132 at least includes operatively coupled an MSC 138, a VLR 140 and an HLR 142. The VLR 140 is further communicatively coupled to the HLR 126 by a communication link 146.

When the subscriber roams into the private wireless communication network 130, the subscriber's mobile station registers with the VLR 140. The VLR 140 may then interrogate either the HLR 126 or the HLR 142. Alternatively, the VLR 140 may interrogate both the HLR 126 and the HLR 142. As a result, the VLR 140 has the flexibility of using the HLR 126 subscriber profile entries, the HLR 142 subscriber profile entries or a hybrid profile constructed from the data received from both the HLR 126 and the HLR 140.

For example, the private network operator may wish to offer a broad range of services to visiting subscribers within the private wireless communication network 130. These services may include various call related services including conference call, call forwarding, voicemail, etc. as well as paging and data services, short message service and Internet access, to name a few of the possible services that may be offered. Thus, regardless of the services authorized within the subscriber's profile contained within the HLR 126, the VLR 140 may interrogate the HLR 142, which will contain a profile for visiting subscribers including the broad set of services available to the visiting subscriber.

Alternatively, the private network operator may wish to limit the services offered to visiting subscribers within the private wireless communication network 130. For example, data services are bandwidth intensive, and the private network operator may want to limit visiting subscribers from using data services. Thus, regardless of the set of services authorized within the subscriber's profile contained within the HLR 126, the VLR 140 may interrogate the HLR 142, which will contain a visiting subscriber profile including a limited set of services available to the visiting subscriber.

Figure 2:
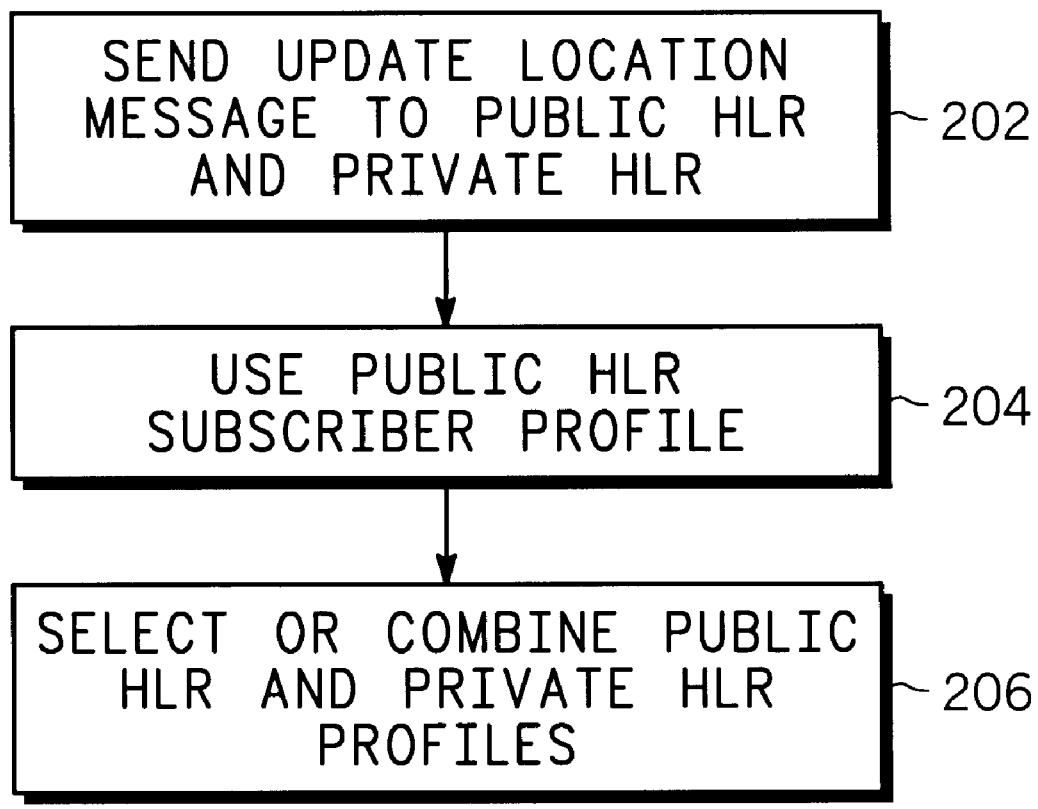
FIG. 2 is a block diagram of a method of providing services in a private wireless communication network according to a preferred embodiment of the invention.

Referring to FIG. 2, a method 200 of providing services in a private wireless communication network begins at step 202 where an update location requests is sent to both HLR 126 and HLR 142. The VLR 140 receives an insert subscriber data message from both the HLR 126 and the HLR 142, step 204, and the VLR 140 then determines which subscriber profile will be used for providing services to the subscribed in the private wireless data network 130, step 206. Alternatively, the VLR 140 may construct a hybrid subscriber profile by combining data from each of the HLR 126 and the HLR 140.

As described, a VLR is adapted to interrogate a private network HLR and a public network HLR in order to determine a level of service to be provided to a visiting subscriber. It will be appreciated that the VLR may be adapted to interrogate any number of HLRs, such as HLRs in adjoining or overlayed public or private networks. The invention, therefore, is not and should not be taken to be limited to the embodiments described herein.

We claim:

1. In a wireless communication system having an embedded wireless communication system, an apparatus for providing services in the embedded wireless communication system, the apparatus comprising:

a visitor location register within the embedded wireless communication system;

an embedded home location register within a switching system of the embedded wireless communication system;

a home location register within a switching system of the wireless communication system; and wherein the visitor location register is coupled to the home location register to receive a first network subscriber profile defining a first set of subscriber services and to the embedded home location register to receive a second network subscriber profile defining a second set of subscriber services different than the first set of subscriber services.

2. The apparatus of claim 1, wherein the visitor location register is operable to select one of the first set of subscriber services and the second set of subscriber services.

3. The apparatus of claim 1, wherein the visitor location register is operable to define a third set of subscriber services based on the first set of subscriber services and the second set of subscriber services.

4. The apparatus of claim 1, wherein the first set of subscriber services is broader than the second set of subscriber services.

5. The apparatus of claim 1, wherein the first set of subscriber services is narrower than the second set of subscriber services.

6. The apparatus of claim 1, wherein the embedded wireless communication system comprises a private wireless communication system.

7. The apparatus of claim 1, wherein the wireless communication system comprises a public wireless communication system.

8. In a wireless communication system having an embedded wireless communication system, a method for providing services in the embedded wireless communication system, the method comprising the steps of:

receiving a first subscriber profile defining a first set of subscriber services from a home location register associated with the wireless communication network;

receiving a second subscriber profile defining a second set of subscriber services from a home location register associated with the embedded wireless communication system; and providing service to a subscriber within the embedded wireless communication system based upon the first set of subscriber services and the second set of subscriber services.

9. The method of claim 8, wherein the step of providing service to a subscriber within the embedded wireless communication system based upon the first set of subscriber services and the second set of subscriber services comprises selecting one of the first set of subscriber services and the second set of subscriber services.

10. The method of claim 8, wherein the step of providing service to a subscriber within the embedded wireless communication system based upon the first set of subscriber services and the second set of subscriber services comprises combining the first set of subscriber services and the second set of subscriber services.

11. In a wireless communication system having an embedded wireless communication system, wherein the wireless communication system includes a home location register and wherein the embedded wireless communication system including a visitor location register and an embedded system home location register, a method for providing services in the embedded wireless communication system, the method comprising the steps of:

coupling the visitor location register to the home location register and the embedded system home location register;

receiving at the visitor location register from the home location register a first subscriber profile defining a first set of subscriber services from a home location register associated with the wireless communication network;

receiving at the visitor location register from the embedded system home location register a second subscriber profile defining a second set of subscriber services from a home location register associated with the embedded wireless communication system; and providing service to a subscriber within the embedded wireless communication system based upon the first set of subscriber services and the second set of subscriber services.

12. The method of claim 11, wherein the step of providing service to a subscriber within the embedded wireless communication system based upon the first set of subscriber services and the second set of subscriber services comprises selecting one of the first set of subscriber services and the second set of subscriber services.

13. The method of claim 11, wherein the step of providing service to a subscriber within the embedded wireless communication system based upon the first set of subscriber services and the second set of subscriber services comprises combining the first set of subscriber services and the second set of subscriber services.

14. The apparatus of claim 11, wherein the first set of subscriber services is broader than the second set of subscriber services.

15. The apparatus of claim 11, wherein the first set of subscriber services is narrower than the second set of subscriber services.

16. The apparatus of claim 11, wherein the embedded wireless communication system comprises a private wireless communication system.

17. The apparatus of claim 11, wherein the wireless communication system comprises a public wireless communication system.

* * * * *